(12) United States Patent
Wu

(10) Patent No.: US 10,024,525 B2
(45) Date of Patent: Jul. 17, 2018

(54) SMD LED MODULE BASED LIGHT

(71) Applicant: Kun-Lung Wu, Kaohsiung (TW)

(72) Inventor: Kun-Lung Wu, Kaohsiung (TW)

(73) Assignee: Black Energy Co., Ltd, Kaohsiung (TW)

(*) Notice: Subject to any disclaimer, the term of this patent is extended or adjusted under 35 U.S.C. 154(b) by 112 days.

(21) Appl. No.: 15/253,890

(22) Filed: Sep. 1, 2016

(65) Prior Publication Data
US 2016/0369982 A1 Dec. 22, 2016

(51) Int. Cl.
| | | |
|---|---|---|
| *F21V 19/00* | (2006.01) | |
| *H05K 1/02* | (2006.01) | |
| *F21S 43/19* | (2018.01) | |
| *F21S 43/14* | (2018.01) | |
| *H05K 1/18* | (2006.01) | |
| *F21Y 115/10* | (2016.01) | |
| *H05K 1/05* | (2006.01) | |

(52) U.S. Cl.
CPC .......... *F21V 19/0025* (2013.01); *F21S 43/14* (2018.01); *F21S 43/195* (2018.01); *H05K 1/0209* (2013.01); *H05K 1/0295* (2013.01); *F21V 19/0015* (2013.01); *F21Y 2115/10* (2016.08); *H05K 1/05* (2013.01); *H05K 1/181* (2013.01); *H05K 2201/10106* (2013.01)

(58) Field of Classification Search
CPC ......... F21V 19/0025; F21V 19/0015; F21S 48/212; F21S 48/215; H05K 1/181; H05K 2201/10106
USPC ................. 362/249.02, 382, 249.06
See application file for complete search history.

(56) References Cited

U.S. PATENT DOCUMENTS

| | | | | |
|---|---|---|---|---|
| 5,857,767 | A * | 1/1999 | Hochstein | F21S 48/328 362/294 |
| 7,070,418 | B1 * | 7/2006 | Wang | F21K 9/00 439/56 |
| 2006/0181878 | A1 * | 8/2006 | Burkholder | F21V 29/004 362/294 |
| 2009/0103295 | A1 * | 4/2009 | Wang | F21K 9/00 362/234 |
| 2011/0228536 | A1 * | 9/2011 | Im | F21S 48/1109 362/249.06 |
| 2016/0029485 | A1 * | 1/2016 | Dummer | H05K 1/181 362/382 |

* cited by examiner

*Primary Examiner* — Laura Tso

(57) ABSTRACT

An SMD LED module based light is provided with a plurality of circuit boards; and a plurality of SMDs mounted on the circuit boards and electrically connected thereto. Each SMD includes a seat having a plurality of pins, an LED mounted one the seat, and two metal fastening members, each having two ends electrically connected to the circuit board and at least one of the pins respectively. The seat is spaced apart from the circuit board. The fastening members and the pins can be joined in one of many different configurations.

4 Claims, 6 Drawing Sheets

SMD LED MODULE BASED LIGHT

BACKGROUND OF THE INVENTION

1. Field of the Invention

The invention relates to SMD LED (Surface-Mounted-Device Light-Emitting Diode) modules and more particularly to an SMD LED module based light.

2. Description of Related Art

A conventional LED light 1 used as an automobile light is shown in FIG. 1 and includes a plurality of Snap on LEDs (light-emitting diodes) 11 and a plurality of copper substrates 12. While the LED light has the advantages of saving energy and compactness, its manufacturing cost (mainly the Snap on LEDs) is relatively high. Thus, low cost SMD LED modules are used to replace the Snap on LEDs in automobile lighting. This is implemented in a conventional SMD LED light as discussed below.

A conventional SMD LED light 2 is shown in FIG. 2 and includes a plurality of SMD LEDs 21 and a plurality of flexible circuit boards 22 with the SMD LEDs 21 mounted thereon. The flexible circuit board 22 includes a metal plate 221 secured to the SMD LED 21, and a conductive plate 222 mounted on the metal plate 221 and electrically connected thereto. Thus, the metal plates 221 are electrically secured together. The metal plates 221 are made of, for example, aluminum and thus the SMD LEDs 21 have an improved heat transfer effect.

However, the conventional SMD LED light 2 still has the following drawbacks: The cost of the flexible circuit boards 22 is relatively high. It consumes more energy. The mounting of the SMD LED 21 on the metal plate 221 is not reliable because they are joined by adhesive.

Thus, the need for improvement still exists.

SUMMARY OF THE INVENTION

It is therefore one object of the invention to provide a lighting device comprising a plurality of circuit boards; and a plurality of SMDs mounted on the circuit boards and electrically connected thereto; wherein each SMD includes a seat having a plurality of pins, an LED mounted one the seat, and two metal fastening members, each having two ends electrically connected to the circuit board and at least one of the pins respectively; and wherein the seat is spaced apart from the circuit board.

The above and other objects, features and advantages of the invention will become apparent from the following detailed description taken with the accompanying drawings.

BRIEF DESCRIPTION OF THE DRAFASTENING MEMBERS

DETAILED DESCRIPTION OF THE INVENTION

Figure 1:
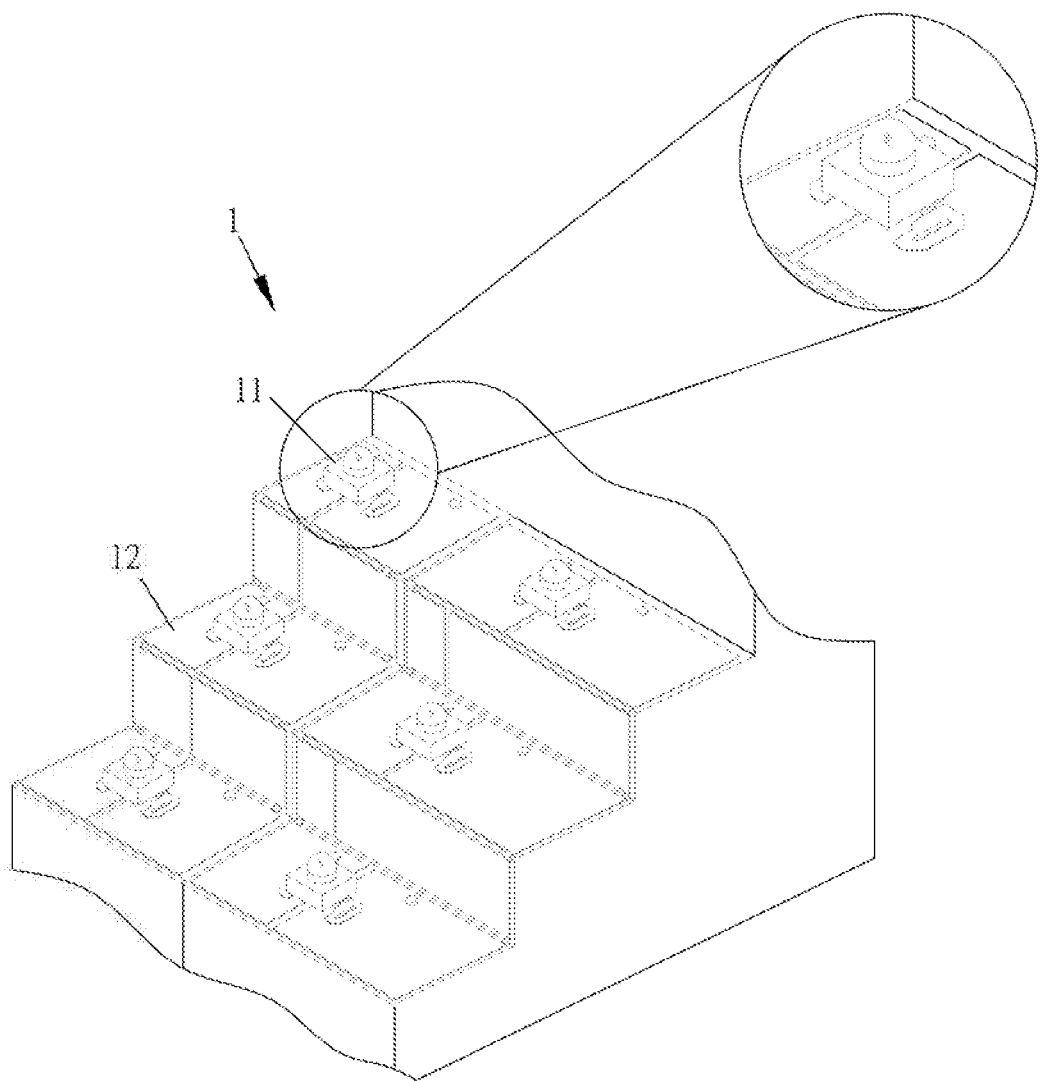
FIG. 1 is a perspective view of a conventional LED light.
Figure 2:
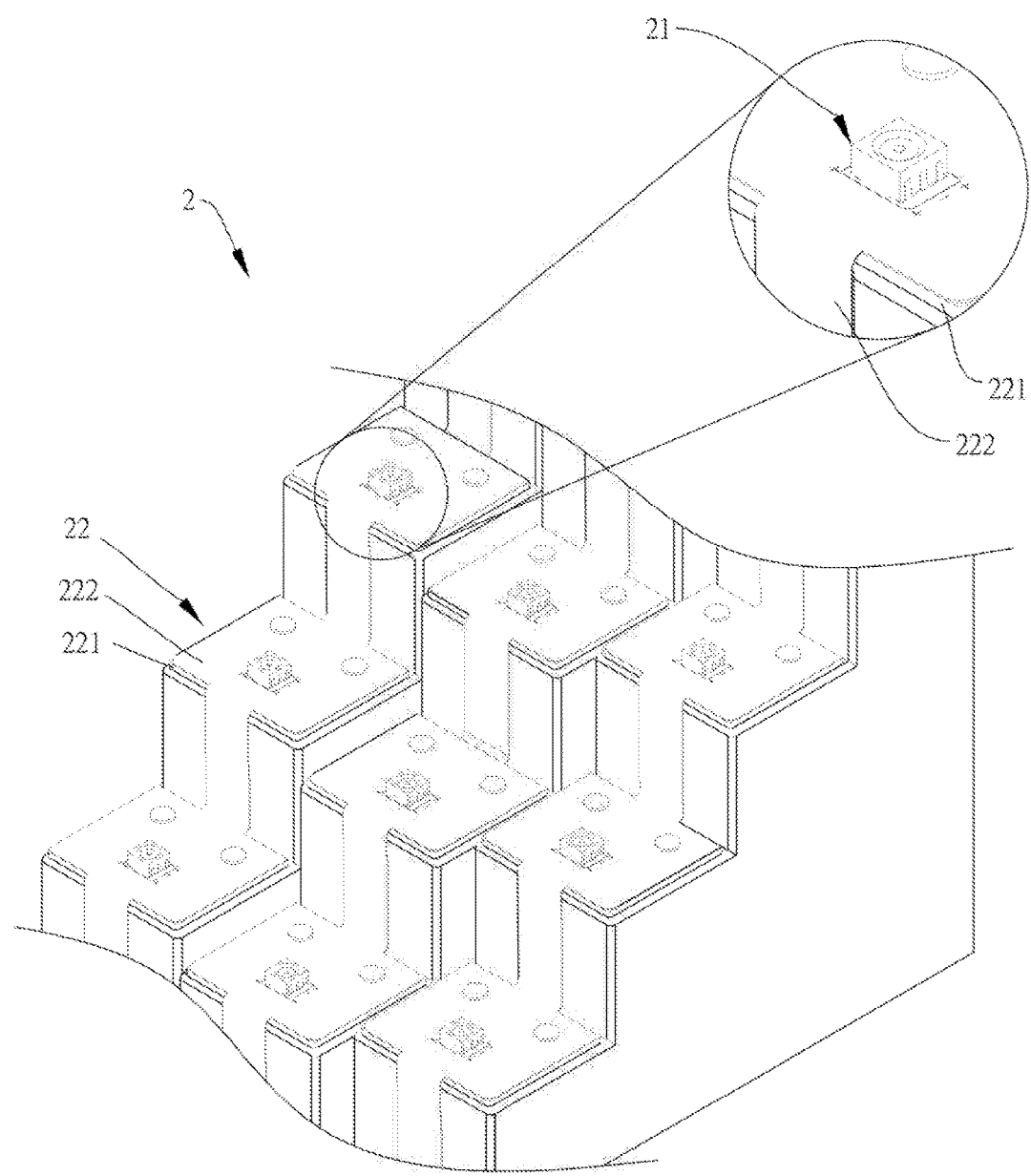
FIG. 2 is a perspective view of a conventional SMD LED light.
Figure 3:
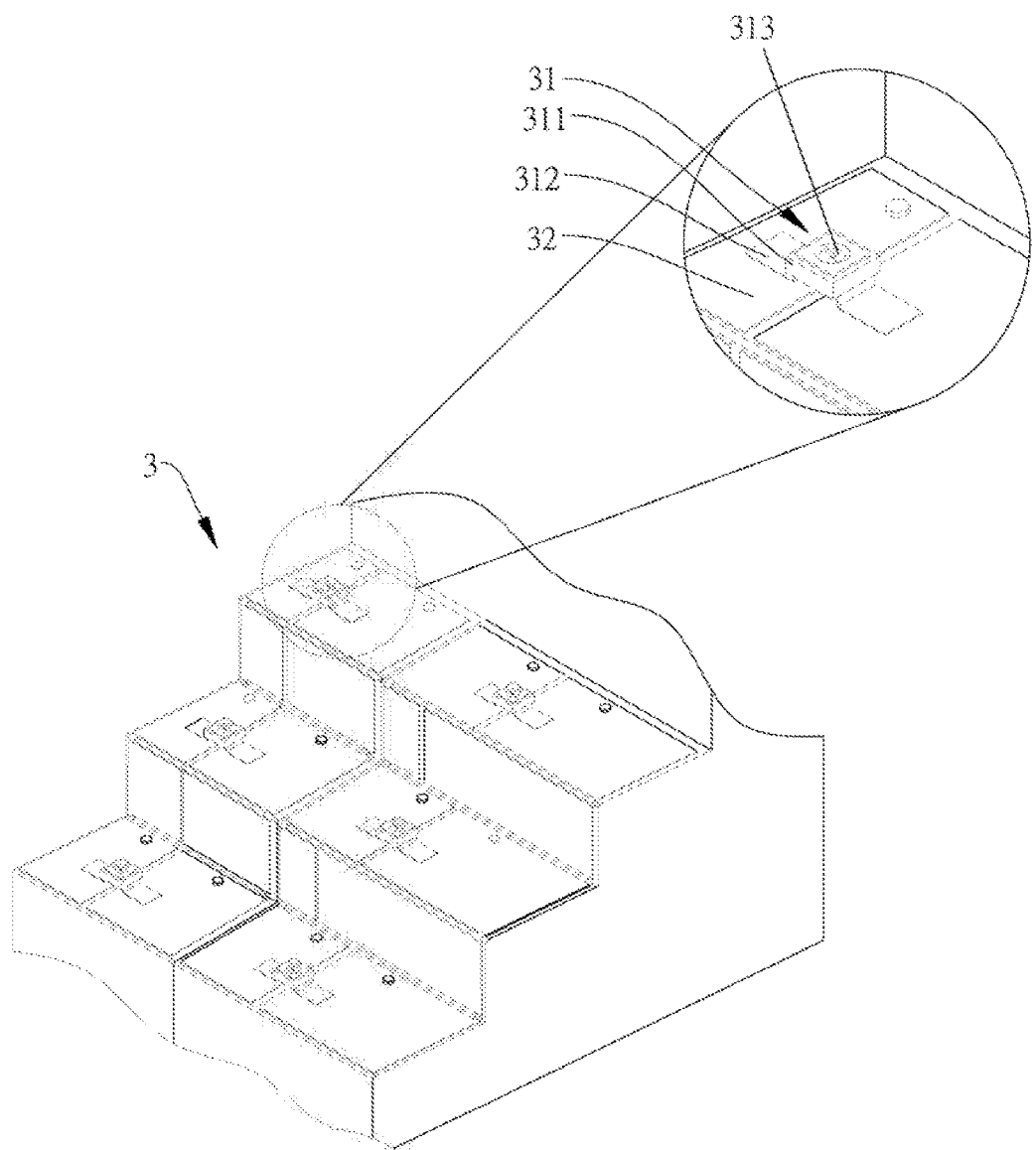
FIG. 3 is a perspective view of a SMD LED module based light according to the invention.
Figure 4:
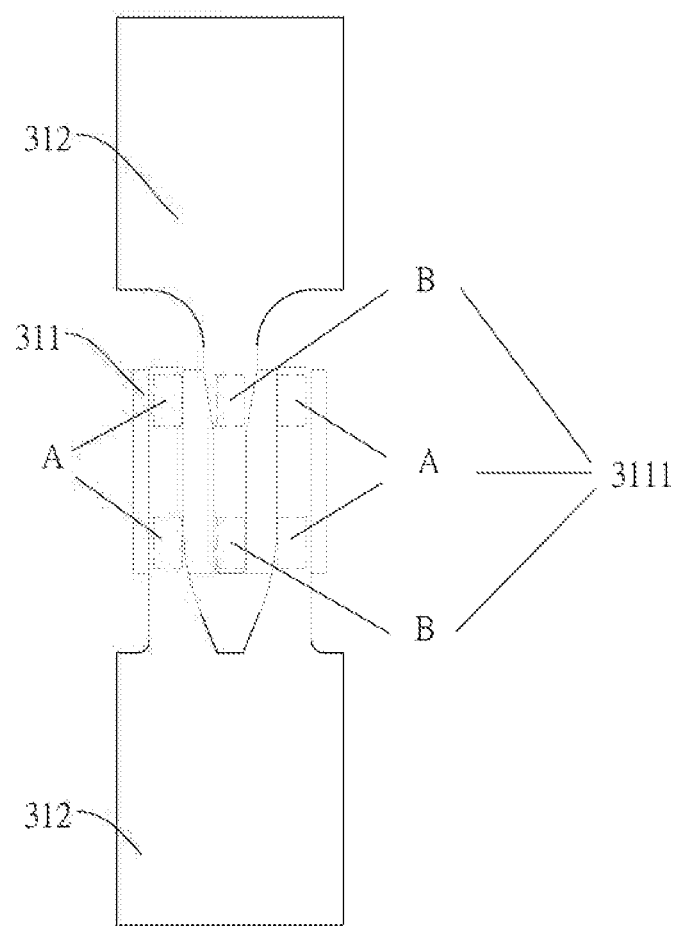
FIG. 4 is a top plan view of a first configuration of the fastening members and the seat.

Referring to FIGS. 3 to 6B, an SMD LED module based light 3 in accordance with the invention comprises a plurality of circuit boards 32 and a plurality of SMDs 31 mounted on the circuit boards 32 and electrically connected thereto. The SMD 31 includes a seat 311 with an LED 313 mounted thereon, and two metal fastening members 312 secured to two sides of the seat 311 respectively. The seat 311 has a plurality of pins 3111. Two ends of the fastening member 312 are electrically connected to the pin 3111 and the circuit board 32 respectively. The circuit board 32 is made of copper substrate (in the invention) or any of other conductive members. The fastening member 312 is secured to the copper substrate of the circuit boards 32 by riveting. The number of the pins 3111 is four, six, or eight and the pins 3111 are configured to join the seat 311 and the fastening members 312 by riveting. Thus, the pins 3111 of the SMD 31 are similar to pins of the conventional a Snap on LED. The SMD 31 can be secured to the circuit board 32 by riveting. That is, no direct contact of the seat 311 and the copper substrate. This can increase the heat transfer effect because the seat 311 is spaced apart from the circuit board 32. As such, the seat 311 has an increased heat transfer. This is a great improvement over the conventional art which is incapable of attaching an SMD to a copper substrate. Further, the high cost Snap on LEDs are replaced by the low cost SMDs 31. As a result, an SMD LED module based light 3 is constructed.

It is noted that the SMDs 31 and the substrate copper can be joined in one of many different configurations. Thus, a wide variety of designs of the light 3 are made possible.

Figure 5A:
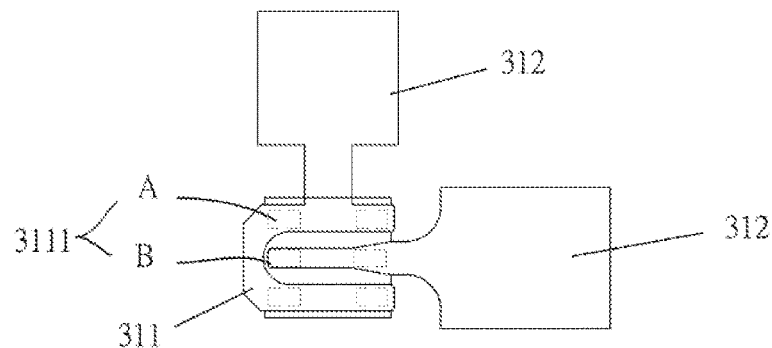
FIG. 5A is a top plan view of a second configuration of the fastening members and the seat.
Figure 5B:
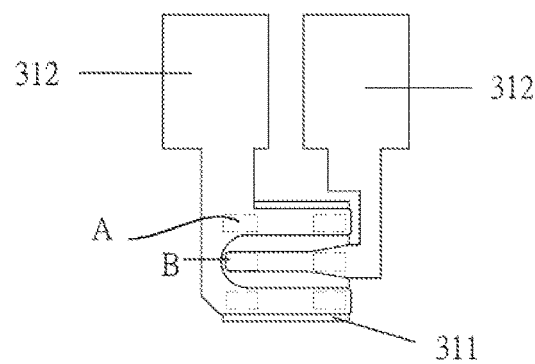
FIG. 5B is a top plan view of a third configuration of the fastening members and the seat.
Figure 5C:
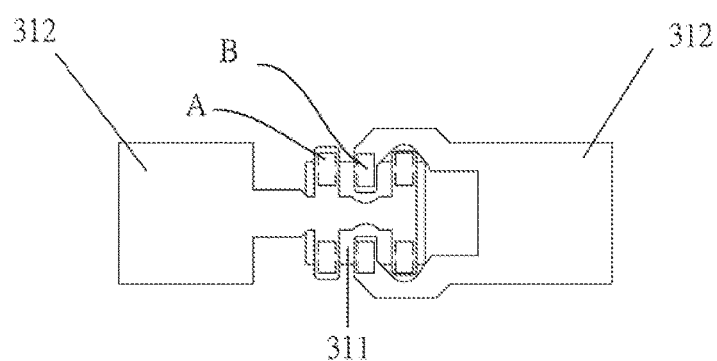
FIG. 5C is a top plan view of a fourth configuration of the fastening members and the seat.

As shown in FIGS. 5A, 5B and 5C specifically, the fastening members 312 are perpendicular to each other and secured to two adjacent sides of the seat 311 respectively (see FIG. 5A); the fastening members 312 are parallel and secured to one side of the seat 311 (see FIG. 5B); and the fastening members 312 are aligned and secured to two opposite sides of the seat 311 respectively (see FIG. 5C). There are six pins 3111 in which four pins 311 are positive pins and labeled A, and two pins 311 are negative pins and labeled B. One fastening member 312 is connected to the positive pins 311 labeled A and the other fastening member 312 is connected to the negative pins 311 labeled B.

Figure 6A:
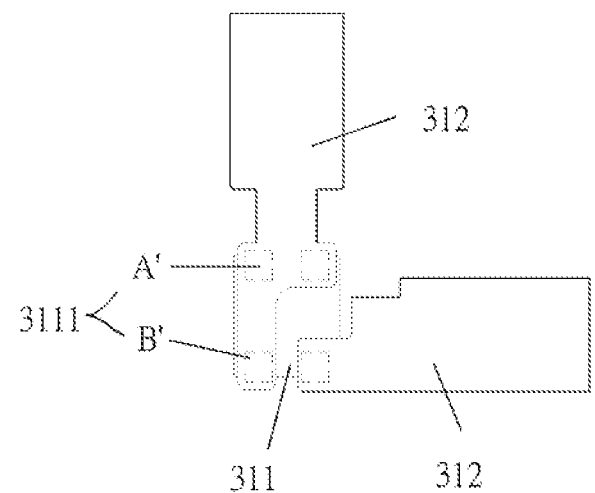
FIG. 6A is a top plan view of a fifth configuration of the fastening members and the seat.
Figure 6B:
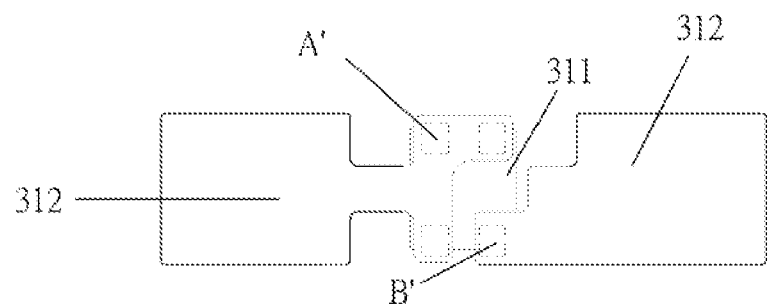
FIG. 6B is a top plan view of a sixth configuration of the fastening members and the seat.

As shown in FIGS. 6A and 6B specifically, the fastening members 312 are perpendicular to each other and secured to two adjacent sides of the seat 311 respectively (see FIG. 6A); and the fastening members 312 are aligned and secured to two opposite sides of the seat 311 respectively (see FIG. 6B). There are four pins 3111 in which three pins 311 are positive pins and labeled A', and one pin 311 is negative pins and labeled B'. One fastening member 312 is connected to the positive pins 311 labeled A' and the other fastening member 312 is connected to the negative pin 311 labeled B'.

While the invention has been described in terms of preferred embodiments, those skilled in the art will recognize that the invention can be practiced with modifications within the spirit and scope of the appended claims.

What is claimed is:

1. A lighting device comprising:
a plurality of circuit boards; and
a plurality of SMDs mounted on the circuit boards and electrically connected thereto;
wherein each SMD includes a seat having a plurality of pins, an LED mounted on the seat, and two metal fastening members, each having two ends electrically connected to the circuit board and at least one of the pins respectively; and
wherein the seat is spaced apart from the circuit board.

2. The lighting device of claim 1, wherein the fastening members are perpendicular to each other and secured to two adjacent sides of the seat respectively.

3. The lighting device of claim 1, wherein the fastening members are parallel and secured to one side of the seat.

4. The lighting device of claim 1, wherein the fastening members are aligned and secured to two opposite sides of the seat respectively.

* * * * *